United States Patent
Botez et al.

(10) Patent No.: US 8,325,774 B2
(45) Date of Patent: Dec. 4, 2012

(54) HIGH POWER, HIGH EFFICIENCY QUANTUM CASCADE LASERS WITH REDUCED ELECTRON LEAKAGE

(75) Inventors: Dan Botez, Madison, WI (US); Jae Cheol Shin, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 253 days.

(21) Appl. No.: 12/855,476

(22) Filed: Aug. 12, 2010

(65) Prior Publication Data

US 2012/0039350 A1    Feb. 16, 2012

(51) Int. Cl.
*H01S 5/00* (2006.01)
(52) U.S. Cl. .............. 372/45.01; 372/43.01; 372/45.012
(58) Field of Classification Search ............... 372/43.01, 372/44.01, 45.01, 45.012; 257/15, E29.168; 977/951

See application file for complete search history.

(56) References Cited

U.S. PATENT DOCUMENTS

| 7,403,552 | B2 | 7/2008 | Botez et al. |
|---|---|---|---|
| 7,558,305 | B2 | 7/2009 | Botez et al. |
| 2005/0036530 | A1 | 2/2005 | Schneider et al. |
| 2008/0151956 | A1 | 6/2008 | Kim et al. |
| 2009/0022196 | A1 | 1/2009 | Botez et al. |
| 2010/0067557 | A1 | 3/2010 | Yang et al. |

FOREIGN PATENT DOCUMENTS

| JP | 2004-311466 A | 11/2004 |
|---|---|---|
| JP | 2007-517411 A | 6/2007 |
| JP | 2010-165994 A | 7/2010 |

OTHER PUBLICATIONS

International Search Report and Written Opinion received in PCT/US2011/039133, Feb. 27, 2012.
Vitiello et al., Influence of InAs, AlAs δ layers on the optical, electronic, and thermal characteristics of strain-compensated GaInAs/AlInAs quantum-cascade lasers, Applied Physics Letters, Oct. 17, 2007, pp. 1-3, vol. 91-No. 161111, American Institute of Physics.
Shin et al., Ultra-low temperature sensitive deep-well quantum cascade lasers ($\lambda$= 4.8 µm) via uptapering conduction band edge of injector regions, Electronics Letters, Jul. 2, 2009, vol. 45-No. 14.
Botez et al., Suppression of carrier leakage in 4.8 [micrometer]—emitting quantum cascade lasers, Novel In-Plane Semiconductor Lasers IX. Ed., Feb. 12, 2010, vol. 76160-No. 9, The International Society for Optical Engineering, U.S.A.
Botez et al., Temperature dependence of the key electro-optical characteristics of mid-infrared emitting quantum cascade lasers, Appl. Phys. Lett., Aug. 16, 2010, pp. 1-3, vol. 97-No. 71101, American Institute of Physics.
Maulini et al., High Power Thermoelectrically Cooled and Uncooled Quantum Cascade Lasers with Optimized Reflectivity Facet Coatings, Applied Physics Letters, Oct. 15, 2009, pp. 1-3, vol. 95, No. 151112, American Institute of Physics.

*Primary Examiner* — Armando Rodriguez
(74) *Attorney, Agent, or Firm* — Bell & Manning, LLC

(57) ABSTRACT

Semiconductor structures and laser devices including the semiconductor structures are provided. The semiconductor structures have a quantum cascade laser (QCL) structure including an electron injector, an active region, and an electron extractor. The active region of the semiconductor structures includes a configuration of quantum wells and barriers that virtually suppresses electron leakage, thereby providing laser devices including such structures with superior electro-optical characteristics.

26 Claims, 9 Drawing Sheets

FIG. 2B

| Layer | Thickness (Å) |
|---|---|
| $In_{0.66}Ga_{0.34}As$ | 28 |
| $Al_{0.65}In_{0.35}As$ | 17 |
| $In_{0.64}Ga_{0.36}As$ | 25 |
| $Al_{0.65}In_{0.35}As$ | 17 |
| $In_{0.64}Ga_{0.36}As$ | 24 |
| $Al_{0.56}In_{0.44}As$ | 20 |
| $In_{0.60}Ga_{0.40}As$ | 22 |
| $Al_{0.56}In_{0.44}As$ | 22 |
| $In_{0.60}Ga_{0.40}As$ | 20 |
| $Al_{0.56}In_{0.44}As$ | 23 |
| $In_{0.60}Ga_{0.40}As$ | 18 |
| $Al_{0.56}In_{0.44}As$ | 25 |
| $In_{0.60}Ga_{0.40}As$ | 17 |
| $Al_{0.56}In_{0.44}As$ | 28 |
| $In_{0.60}Ga_{0.40}As$ | 17 |
| $Al_{0.56}In_{0.44}As$ | 28 |
| $Al_{0.65}In_{0.35}As$ | 11 |
| $In_{0.68}Ga_{0.32}As$ | 11 |
| $Al_{0.65}In_{0.35}As$ | 11 |
| $In_{0.68}Ga_{0.32}As$ | 42 |
| $Al_{0.65}In_{0.35}As$ | 11 |
| $In_{0.68}Ga_{0.32}As$ | 40 |
| $Al_{0.75}In_{0.25}As$ | 13 |
| $In_{0.68}Ga_{0.32}As$ | 36 |
| $Al_{0.75}In_{0.25}As$ | 22 |

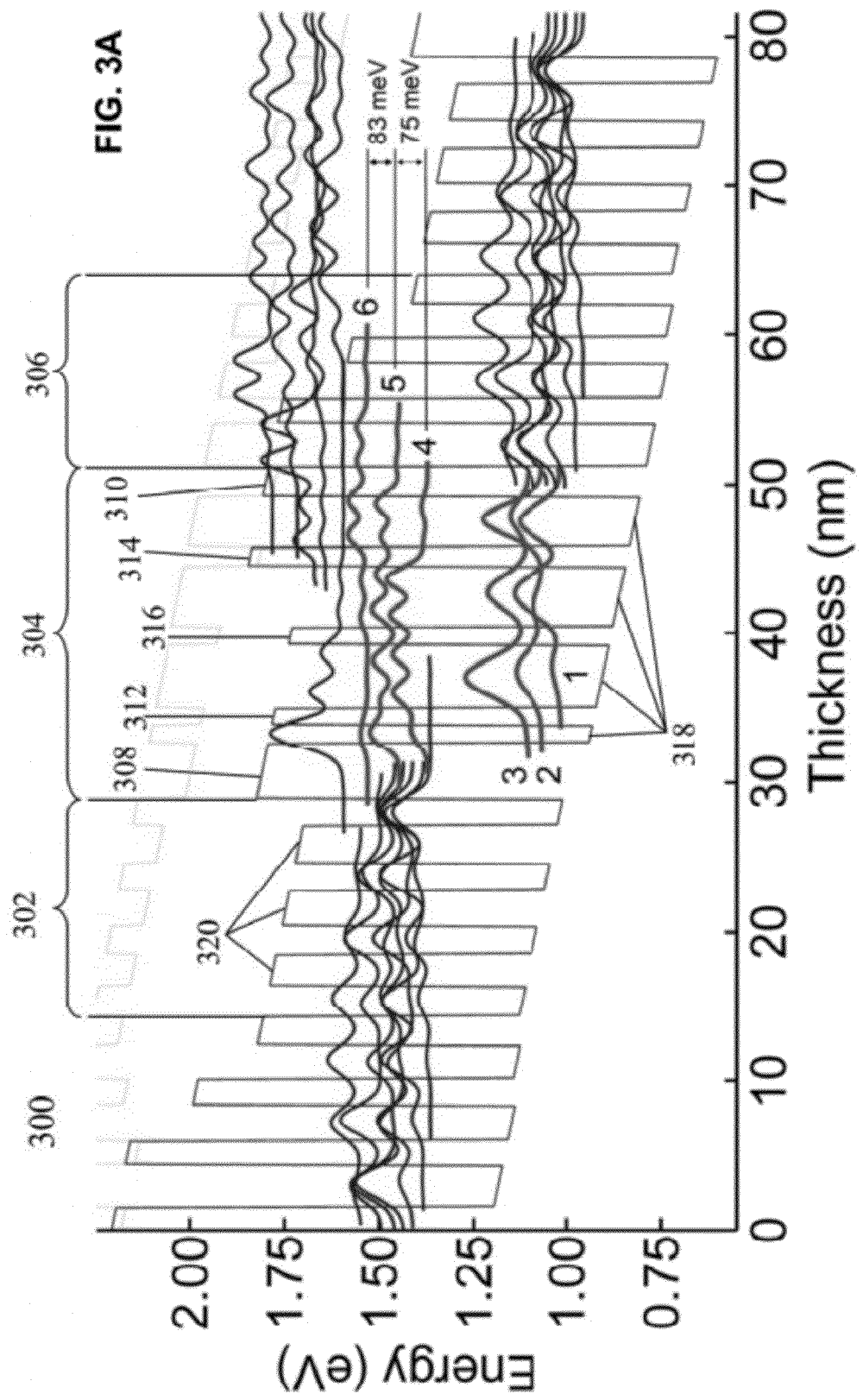

FIG. 3B

| Layer | Thickness (Å) |
|---|---|
| $In_{0.68}Ga_{0.32}As$ | 29 |
| $Al_{0.75}In_{0.25}As$ | 16 |
| $In_{0.68}Ga_{0.32}As$ | 24 |
| $Al_{0.65}In_{0.35}As$ | 17 |
| $In_{0.64}Ga_{0.36}As$ | 23 |
| $Al_{0.56}In_{0.44}As$ | 19 |
| $In_{0.60}Ga_{0.40}As$ | 21 |
| $Al_{0.56}In_{0.44}As$ | 21 |
| $In_{0.60}Ga_{0.40}As$ | 19 |
| $Al_{0.56}In_{0.44}As$ | 24 |
| $In_{0.60}Ga_{0.40}As$ | 18 |
| $Al_{0.56}In_{0.44}As$ | 25 |
| $In_{0.60}Ga_{0.40}As$ | 18 |
| $Al_{0.65}In_{0.35}As$ | 38 |
| $In_{0.68}Ga_{0.32}As$ | 12 |
| $Al_{0.65}In_{0.35}As$ | 11 |
| $In_{0.68}Ga_{0.32}As$ | 42 |
| $Al_{0.65}In_{0.35}As$ | 12 |
| $In_{0.68}Ga_{0.32}As$ | 41 |
| $Al_{0.75}In_{0.25}As$ | 13 |
| $In_{0.68}Ga_{0.32}As$ | 34 |
| $Al_{0.75}In_{0.25}As$ | 20 |

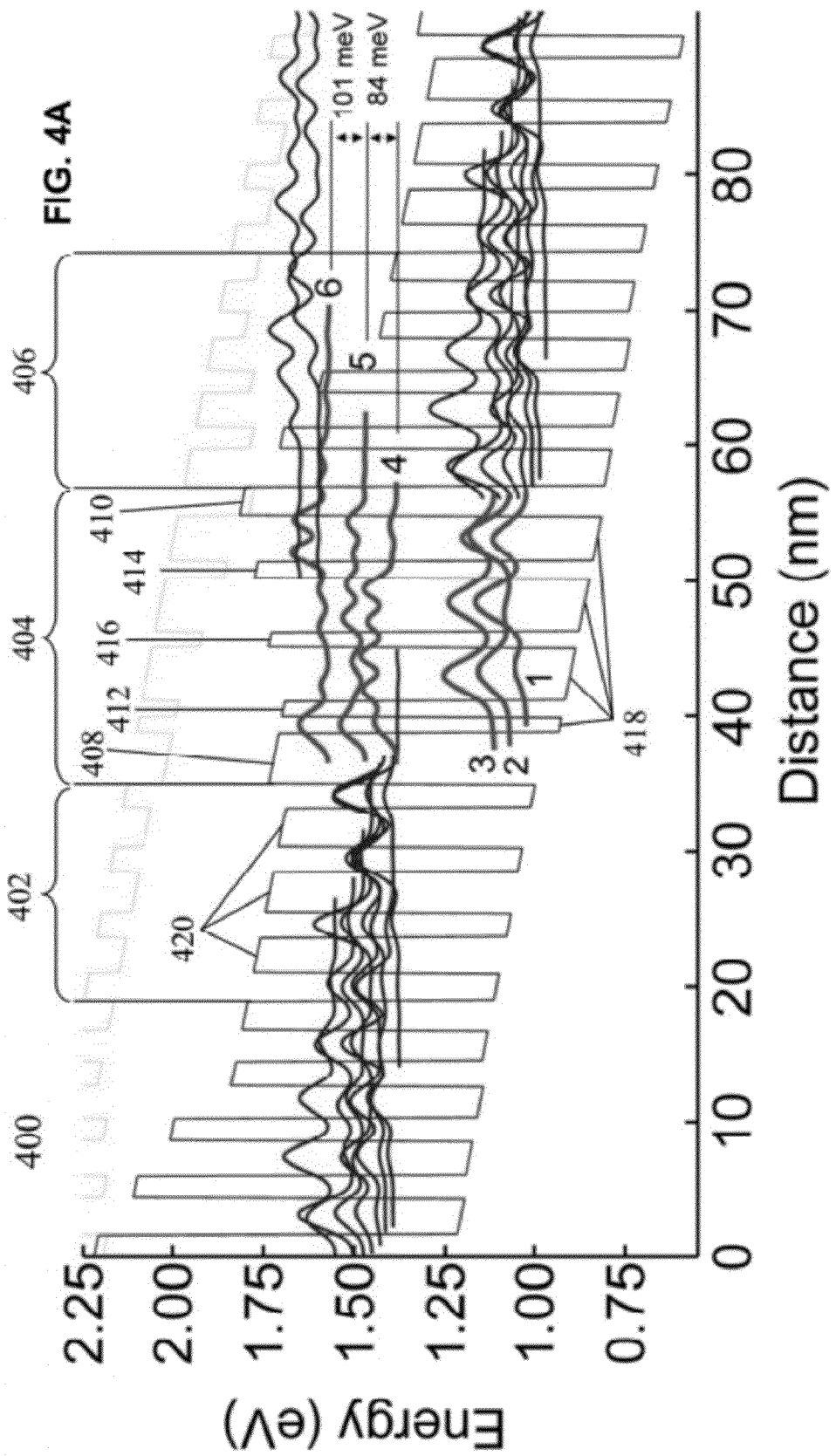

FIG. 4B

| Layer | Thickness (Å) |
|---|---|
| $In_{0.66}Ga_{0.34}As$ | 27 |
| $Al_{0.70}In_{0.30}As$ | 17 |
| $In_{0.64}Ga_{0.36}As$ | 25 |
| $Al_{0.65}In_{0.35}As$ | 17 |
| $In_{0.64}Ga_{0.36}As$ | 23 |
| $Al_{0.56}In_{0.44}As$ | 20 |
| $In_{0.60}Ga_{0.40}As$ | 22 |
| $Al_{0.56}In_{0.44}As$ | 22 |
| $In_{0.60}Ga_{0.40}As$ | 20 |
| $Al_{0.56}In_{0.44}As$ | 27 |
| $In_{0.60}Ga_{0.40}As$ | 18 |
| $Al_{0.56}In_{0.44}As$ | 30 |
| $In_{0.60}Ga_{0.40}As$ | 18 |
| $Al_{0.56}In_{0.44}As$ | 30 |
| $In_{0.60}Ga_{0.40}As$ | 17 |
| $Al_{0.60}In_{0.40}As$ | 38 |
| $In_{0.68}Ga_{0.32}As$ | 11 |
| $Al_{0.60}In_{0.40}As$ | 12 |
| $In_{0.68}Ga_{0.32}As$ | 40 |
| $Al_{0.65}In_{0.35}As$ | 12 |
| $In_{0.68}Ga_{0.32}As$ | 39 |
| $Al_{0.70}In_{0.30}As$ | 13 |
| $In_{0.68}Ga_{0.32}As$ | 33 |
| $Al_{0.75}In_{0.25}As$ | 22 |

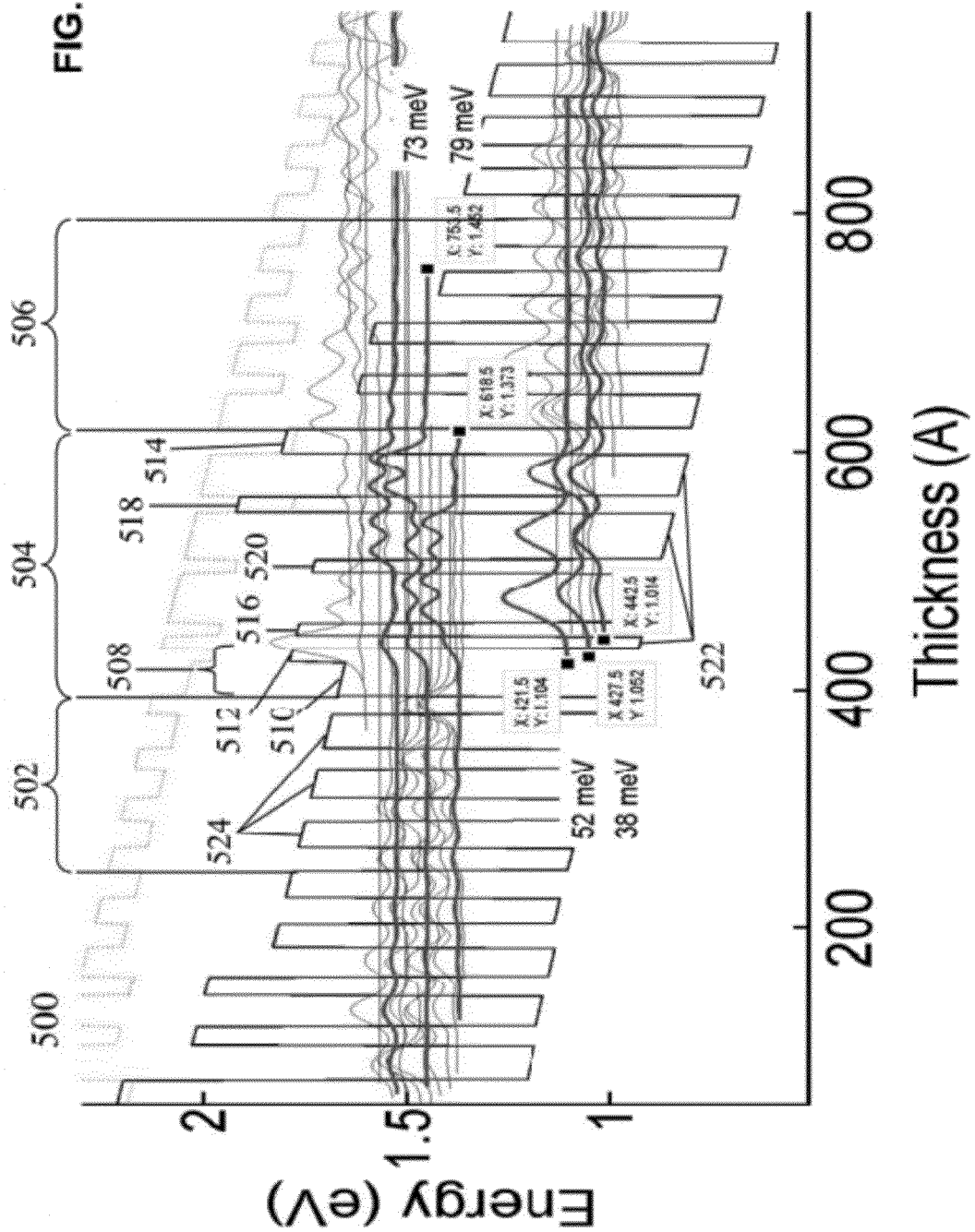

FIG. 5B

| Layer | Thickness (Å) |
|---|---|
| $In_{0.66}Ga_{0.34}As$ | 28 |
| $Al_{0.65}In_{0.35}As$ | 17 |
| $In_{0.64}Ga_{0.36}As$ | 25 |
| $Al_{0.65}In_{0.35}As$ | 17 |
| $In_{0.64}Ga_{0.36}As$ | 24 |
| $Al_{0.56}In_{0.44}As$ | 20 |
| $In_{0.60}Ga_{0.40}As$ | 22 |
| $Al_{0.56}In_{0.44}As$ | 22 |
| $In_{0.60}Ga_{0.40}As$ | 20 |
| $Al_{0.56}In_{0.44}As$ | 23 |
| $In_{0.60}Ga_{0.40}As$ | 18 |
| $Al_{0.56}In_{0.44}As$ | 25 |
| $In_{0.60}Ga_{0.40}As$ | 17 |
| $Al_{0.56}In_{0.44}As$ | 28 |
| $In_{0.60}Ga_{0.40}As$ | 17 |
| $Al_{0.56}In_{0.44}As$ | 28 |
| $Al_{0.65}In_{0.35}As$ | 11 |
| $In_{0.68}Ga_{0.32}As$ | 11 |
| $Al_{0.65}In_{0.35}As$ | 11 |
| $In_{0.68}Ga_{0.32}As$ | 42 |
| $Al_{0.65}In_{0.35}As$ | 11 |
| $In_{0.68}Ga_{0.32}As$ | 40 |
| $Al_{0.80}In_{0.20}As$ | 13 |
| $In_{0.68}Ga_{0.32}As$ | 36 |
| $Al_{0.75}In_{0.25}As$ | 22 |

HIGH POWER, HIGH EFFICIENCY QUANTUM CASCADE LASERS WITH REDUCED ELECTRON LEAKAGE

REFERENCE TO GOVERNMENT RIGHTS

This invention was made with United States government support awarded by the following agency: the National Science Foundation under grant number ECCS-0925104. The United States government has certain rights in this invention.

BACKGROUND

Quantum cascade lasers (QCLs) are made of stages each of which is composed of three regions: an electron injector, an active region and an electron extractor. In conventional QCLs, the quantum wells and barriers in all regions are of the same, fixed alloy composition, respectively. The electrons in the injectors of short wavelength (λ~4.8 µm) QCLs are found to have a higher temperature than that of the lattice. Consequently, such devices optimized for high continuous-wave (CW) power and emitting in the 4.5-5.0 µm range experience substantial electron leakage from the upper laser state and thus, the electro-optical characteristics of the devices are highly sensitive to temperature above room temperature. In particular, these devices exhibit a rapid decrease in the differential quantum efficiency $\eta_d$ above 300 K (i.e., the characteristic temperature for $\eta_d$, $T_1$, has a low value of ~140 K) and also a relatively fast increase in the threshold-current density, $J_{th}$, above 300 K (i.e., the characteristic temperature for $J_{th}$, $T_0$, has low values of ~140 K). As a result, the maximum CW wallplug efficiency $\eta_{wp,\,max}$ (for light emitted at 300 K from the front facet of devices with high-reflectivity-coated back facets) has typical values of ~12%, far short of the theoretically predicted upper limit of ~28% (λ=4.6 µm).

State-of-the-art QCLs have been developed which exhibit lower electron leakage and as a consequence higher $T_1$ and $T_0$ values. See J. C. Shin et al, "Ultra-low temperature sensitive deep-well quantum cascade lasers (λ=4.8 µm) via uptapering conduction band edge of injector regions," *Electronics Letters*, Jul. 2, 2009, Vol. 45, No. 14. However, the room temperature $J_{th}$ values for these QCLs are essentially the same as for conventional QCLs because the laser transition efficiency decreases by about 20% compared to conventional QCLs.

SUMMARY

Semiconductor structures and laser devices including the semiconductor structures are provided.

One aspect of the invention provides semiconductor structures. The semiconductor structures include an electron injector, an active region adjacent to the electron injector, and an electron extractor adjacent to the active region. The electron injector, active region, and electron extractor each include layers of semiconductor, the layers configured to provide alternating quantum wells and barriers. The active region includes an injection barrier, an exit barrier, a first intermediate barrier between the injection barrier and the exit barrier, and a second intermediate barrier between the injection barrier and the exit barrier and downstream from the first intermediate barrier. The energy of each of the exit barrier, the first intermediate barrier, and the second intermediate barrier is greater than the energy of the barriers of the electron injector. The energy of the injection barrier may also be greater than the energy of the barriers of the electron injector. Finally, the energy of the injection barrier is less than the energy of the exit barrier and the energy of the first intermediate barrier is less than the energy of the second intermediate barrier. The energies of the first intermediate barrier and the second intermediate barrier may have a range of values relative to the energies of the injection barrier and exit barrier, respectively.

The semiconductor structures may include a third intermediate barrier between the first intermediate barrier and the second intermediate barrier. The energy of the third intermediate barrier is greater than the energy of the barriers in the electron injector and may assume a range of values relative to the energies of the first and second intermediate barriers.

The barriers of the active region of the semiconductor structures may be composite barriers. The quantum wells of the active region of the semiconductor structures may be deep quantum wells. The semiconductor structures may include quantum wells and barriers having a variety of compositions.

The active region of the semiconductor structures includes upper energy states 4, 5, and 6. The active region of the semiconductor structure may be characterized by an energy difference between energy states 4 and 5 ($E_{54}$) of at least about 70 meV. The active region of the semiconductor structure may also be characterized by an energy difference between energy states 5 and 6 ($E_{65}$) of at least about 70 meV.

The semiconductor structures may be configured to provide laser devices emitting radiation in the mid- to long-wavelength infrared range (i.e., 3-12 µm). Thus, another aspect of the invention provides the laser devices including any of the disclosed semiconductor structures. The laser devices may exhibit superior electro-optical characteristics, including low relative leakage current values at room temperature (e.g., $J_{leak}/J_{th}$ of no more than about 5%), low values of $J_{th}$ at room-temperature (e.g., no more than about 1.7 kA/cm² for a 30-stage, 3 mm-long device with uncoated mirror facets), and high maximum wallplug efficiencies at room temperature (e.g., $\eta_{wp.max}$ greater than about 15%.)

Exemplary semiconductor structures having specific configurations and compositions of barriers and quantum wells in the active region of the structures are described herein. Electro-optical characteristics for laser devices including such structures are also provided.

Other principal features and advantages of the invention will become apparent to those skilled in the art upon review of the following drawings, the detailed description, and the appended claims.

BRIEF DESCRIPTION OF THE DRAWINGS

Exemplary embodiments of the invention will hereafter be described with reference to the accompanying drawings.

FIG. 2B shows the compositions and thicknesses of each of the quantum wells and barriers in the semiconductor structure of FIG. 2A.

FIG. 3A shows the band diagram and relevant wavefunctions for an exemplary embodiment of the disclosed semiconductor structures.

FIG. 3B shows the compositions and thicknesses of each of the quantum wells and barriers in the semiconductor structure of FIG. 3A.

FIG. 4A shows the band diagram and relevant wavefunctions for an exemplary embodiment of the disclosed semiconductor structures.

FIG. 4B shows the compositions and thicknesses of each of the quantum wells and barriers in the semiconductor structure of FIG. 4A.

FIG. 5A shows the band diagram and relevant wavefunctions for an exemplary embodiment of the disclosed semiconductor structures.

FIG. 5B shows the compositions and thicknesses of each of the quantum wells and barriers in the semiconductor structure of FIG. 5A.

DETAILED DESCRIPTION

Semiconductor structures and laser devices including the semiconductor structures are provided. The semiconductor structures are capable of providing laser devices emitting mid- to long-wavelength infrared (i.e., 3-12 µm) radiation and operating at high power (i.e., watt-range) and high wallplug efficiency during quasi-continuous wave or continuous wave (CW) operation over long periods of time (i.e., >1000 hours). Such laser devices are suited for use in a variety of applications, ranging from environmental monitoring to remote detection of explosives and to missile-avoidance systems for both commercial and military air vehicles.

The present invention is based, at least in part, on the inventors' discovery that electron leakage in QCLs can be virtually suppressed by using certain configurations of the barriers and quantum wells in the active regions of such devices. Thus, laser devices including certain of the disclosed semiconductor structures exhibit superior electro-optical characteristics as compared to both conventional and state-of-the-art QCLs. By way of example only, electron leakage in certain of the disclosed laser devices may be about a factor of 3 less than state-of-the-art QCLs and about a factor of 6 less than conventional QCLs. Room temperature $J_{th}$ values may be about 20% smaller than both state-of-the-art and conventional QCLs without decreasing the matrix element between lasing levels (a problem with state-of-the-art QCLs). The combination of low $J_{th}$ values and virtually suppressed electron leakage leads to significantly higher front-facet or single-facet CW wallplug efficiencies (e.g., about 22%) at room temperature. Finally, the CW wallplug efficiency may vary with temperature about 3 times more slowly as compared to conventional QCLs, enabling long-term, stable operation at elevated temperatures and at watt-range power levels. It is to be understood that the electro-optical values noted above are merely exemplary electro-optical values for the disclosed laser devices. Other values are possible.

Figure 1:
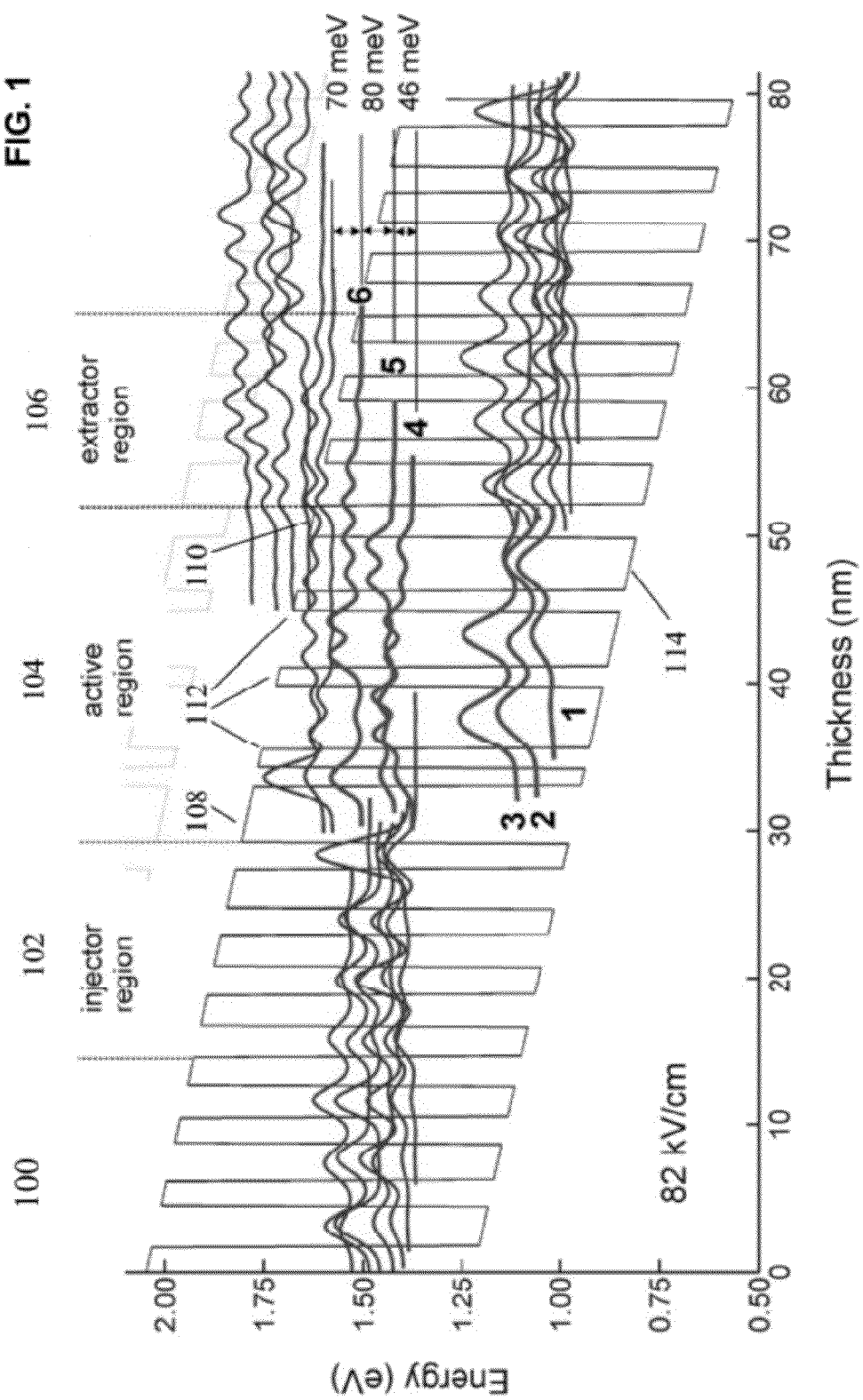
FIG. 1 shows the band diagram and relevant wavefunctions for a conventional QCL.

For purposes of providing additional background for the disclosed invention, FIG. 1 shows the band diagram and relevant wavefunctions for a conventional QCL. One stage 100 of the QCL includes an injector region 102, an active region 104, and an extractor region 106. The barriers of the active region include an injection barrier 108, an exit barrier 110, and intermediate barriers 112. Electrons are injected from the ground level, g, in the injector region into the upper laser state 4 in the active region. Some electrons relax down to the lower laser state 3, with light being emitted at the desired wavelength. The primary electron leakage paths from the upper laser state 4 involve thermal excitation of the electrons to state 5, wherefrom they either relax to the lower energy states 3, 2, and 1 or are further excited to state 6. For state 6, electron leakage involves both relaxation to states 3, 2, and 1 and excitation to the upper-Γ-miniband states and subsequently to the continuum. FIG. 1 also provides the energy difference between states 4 and 5 ($E_{54}$=46 meV); the energy difference between states 5 and 6 ($E_{65}$=80 meV); and the energy difference between state 6 and the bottom state in the upper-Γ-miniband ($E_{um,6}$=70 meV).

In order to calculate the relevant electro-optical properties for the disclosed laser devices, the conventional equations for threshold current density, $J_{th}$, differential quantum efficiency, $\eta_d$, and maximum wallplug efficiency, $\eta_{wp.max}$, for QCLs must be modified to account for the effects of electron leakage and backfilling. The equations, including a detailed discussion of the derivation of the equations, may be found in D. Botez, et al., "Temperature dependence of the key electro-optical characteristics for mid-infrared emitting quantum cascade lasers," *Applied Physics Letters*, accepted for publication, July 2010.

In a basic embodiment, a semiconductor structure providing a laser device with superior electro-optical characteristics includes an electron injector, an active region adjacent to the electron injector, and an electron extractor adjacent to the active region. The electron injector, active region, and electron extractor each include layers of semiconductor, the layers configured to provide alternating quantum wells and barriers. The active region includes an injection barrier, an exit barrier, a first intermediate barrier between the injection barrier and the exit barrier, and a second intermediate barrier between the injection barrier and the exit barrier and downstream from the first intermediate barrier. The energy of each of the exit barrier, the first intermediate barrier, and the second intermediate barrier is greater than the energy of the barriers of the electron injector. In some embodiments, the energy of the injection barrier is also greater than the energy of the barriers of the electron injector. Finally, the energy of the injection barrier is less than the energy of the exit barrier and the energy of the first intermediate barrier is less than the energy of the second intermediate barrier.

The energy of a barrier in the active region may be defined as the difference in energy between the top of the barrier and the bottom of the adjacent, upstream quantum well. For example, in the conventional QCL of FIG. 1, the energy of the exit barrier 110 is the difference in energy between the top of the barrier 110 and the bottom of the adjacent, upstream quantum well 114.

The energies of the first intermediate barrier and the second intermediate barrier may have a range of values (i.e., less than, equal to, or greater than) relative to the energies of the injection barrier and exit barrier, respectively. However, in some embodiments, the energy of the first intermediate barrier is equal to or greater than the energy of the injection barrier. In other embodiments, the energy of the first intermediate barrier is equal to or greater than the energy of the injection barrier and the energy of the second intermediate barrier is equal to or less than the energy of the exit barrier. In still further embodiments, the energy of the first intermediate barrier is equal to or greater than the energy of the injection barrier and the energy of the second intermediate barrier is greater than the energy of the exit barrier.

The disclosed semiconductor structures may include a third intermediate barrier between the first intermediate barrier and the second intermediate barrier, wherein the energy of the third intermediate barrier is greater than the energy of the barriers in the electron injector. Relative to the first and second intermediate barriers, the energy of the third intermediate barrier may range from the energy of the first intermediate barrier to the energy of the second intermediate barrier in some embodiments. In such embodiments, the energies of the first intermediate barrier and the second intermediate barrier may be any of the energies disclosed above. In some embodiments, the energy of the first intermediate barrier is greater than the energy of the injection barrier, the energy of the second intermediate barrier is equal to the energy of the exit barrier, and the energy of the third intermediate barrier is equal to the energy of the first intermediate barrier.

In other embodiments, the energy of the first intermediate barrier is equal to the energy of the injection barrier, the energy of the second intermediate barrier is equal to the energy of the exit barrier, and the energy of the third intermediate barrier is equal to the energy of the first intermediate barrier.

In still other embodiments, the energy of the first intermediate barrier is equal to the energy of the injection barrier, the energy of the second intermediate barrier is less than the energy of the exit barrier, and the energy of the third intermediate barrier is both greater than the energy of the first intermediate barrier and less than the energy of the second intermediate barrier.

In still further embodiments, the energy of the first intermediate barrier is greater than the energy of the injection barrier, the energy of the second intermediate barrier is greater than the energy of the exit barrier, and the energy of the third intermediate barrier is equal to the energy of the first intermediate barrier.

Figure 2A:
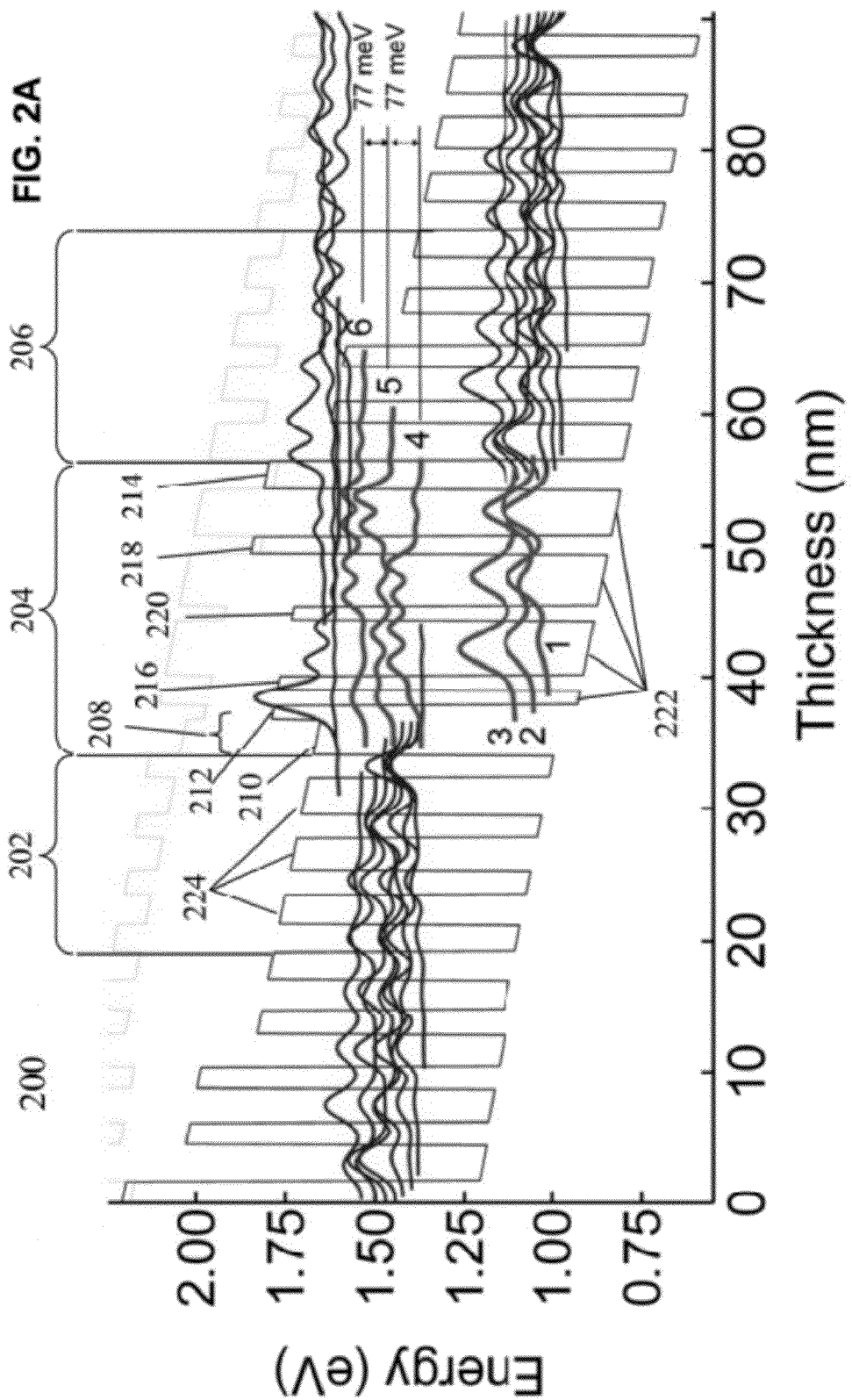
FIG. 2A shows the band diagram and relevant wavefunctions for an exemplary embodiment of the disclosed semiconductor structures.

The barriers of the active region of the disclosed semiconductor structures may be composite barriers. Composite barriers are barriers composed of two or more barrier layers of different semiconductors. The energy of a composite barrier is of intermediate value between the energy of the barrier layer of highest energy and the energy value of the barrier layer of lowest energy. An exemplary composite barrier 208 is shown in FIG. 2A. This composite barrier includes a first barrier layer 210 and a second barrier layer 212. As shown in FIG. 2B, the compositions of the first barrier layer ($Al_{0.56}In_{0.44}As$) and second barrier layer ($Al_{0.65}In_{0.35}As$) differ. In some embodiments, the injection barrier in any of the disclosed semiconductor structures is a composite injection barrier including a first barrier layer and a second barrier layer.

The quantum wells of the active region of the disclosed semiconductor structures may be deep quantum wells. A deep quantum well is a quantum well having a well bottom that is lower in energy than the bottoms of the quantum wells in the adjacent electron injector. Exemplary deep quantum wells 222 are shown in FIG. 2A. In some embodiments, at least one of the quantum wells in the active region is a deep quantum well. In other embodiments, each of the quantum wells in the active region is a deep quantum well.

The disclosed semiconductor structures may include quantum wells and barriers having a variety of compositions. In some embodiments, the semiconductor structure includes quantum wells including InGaAs and barriers including AlInAs. In such embodiments, the semiconductor structure could also include barriers including AlAs. In other embodiments, the semiconductor structure includes quantum wells including InGaAs and barriers including AlAsSb. In such embodiments, the semiconductor structure could also include barriers including AlAs. In still further embodiments, the semiconductor structure includes quantum wells including GaAs and barriers including AlGaAs. In still further embodiments, the semiconductor structure includes quantum wells including InGaAs, quantum wells including GaAs, barriers including AlGaAs, barriers including AlGaAsP, and barriers including GaAsP. Specific, exemplary compositions for quantum wells and barriers are provided in FIGS. 2B, 3B, 4B, and 5B. Other possible compositions are found in U.S. Pat. Nos. 7,558,305 and 7,403,552.

The active region of the disclosed semiconductor structures includes upper energy states 4, 5, and 6 (e.g., see the exemplary embodiments shown in FIGS. 2A, 3A, 4A, and 5A), wherein the energy difference between energy states 4 and 5 is denoted by $E_{54}$ and the energy difference between energy states 5 and 6 is denoted by $E_{65}$. By contrast to conventional and state-of-the-art QCLs, the disclosed semiconductor structures provide much greater values of $E_{54}$ and $E_{65}$, resulting in the virtual suppression of electron leakage. In some embodiments, $E_{54}$ is at least about 70 meV. In other embodiments, $E_{54}$ is at least about 75 meV or at least about 80 meV. In some embodiments, $E_{65}$ is at least about 70 meV. In other embodiments, $E_{65}$ is at least about 75 meV, at least about 80 meV, at least about 85 meV, at least about 90 meV, at least about 95 meV, or at least about 100 meV.

The disclosed semiconductor structures may be configured to provide laser devices emitting in the mid- to long-wavelength infrared range (i.e., 3-12 μm). In some embodiments, the semiconductor structure is configured to provide a laser device emitting radiation in the wavelength range from about 3 μm to about 5 μm, from about 4 μm to about 5 μm, from about 4.5 μm to about 5 μm, from greater than about 5 μm, from greater than about 8 μm, or from about 8 μm to about 12 μm. Thus, also provided are the laser devices including any of the disclosed semiconductor structures. Such laser devices include a plurality of laser stages, each laser stage comprising any of the disclosed semiconductor structures. In some embodiments, the laser devices include at least 10, at least 25, at least 30, or at least 40 laser stages. The laser devices may include other known components for configuring QCL-type semiconductor structures into laser devices, e.g. an additional extractor region and injector region for providing a final electron Bragg mirror, a transverse optical waveguide, a substrate, and a contact layer. Additional details regarding certain of these components may be found in at least J. C. Shin et al, "Ultra-low temperature sensitive deep-well quantum cascade lasers (λ=4.8 μm) via uptapering conduction band edge of injector regions," *Electronics Letters*, Jul. 2, 2009, Vol. 45, No. 14.

As noted above, the disclosed semiconductor structures are capable of providing laser devices including the structures with superior electro-optical characteristics, including low electron leakage, low values of $J_{th}$ at room temperature, and high maximum wallplug efficiencies. In some embodiments, the semiconductor structure is configured to provide a laser device emitting from about 4 μm to about 5 μm, wherein the laser device is characterized by a relative leakage current value ($J_{leak}/J_{th}$) of no more than about 5%, no more than about 4%, or no more than about 3%. The threshold-current density, $J_{th}$, may be calculated as described above, or may be experimentally determined using known methods. The electron leakage, $J_{leak}$, may also be calculated from the appropriate equations found in D. Botez, et al., "Temperature dependence of the key electro-optical characteristics for mid-infrared emitting quantum cascade lasers," *Applied Physics Letters*, accepted for publication, July 2010.

In some embodiments, the semiconductor structure is configured to provide a laser device emitting radiation in the wavelength range from about 4.5 μm to about 5 μm, wherein the laser device is characterized by a room temperature $J_{th}$ value of no more than about 1.7 kA/cm², no more than about 1.6 kA/cm², no more than about 1.5 kA/cm², or no more than about 1.4 kA/cm² for 30-stage, 3 mm-long, uncoated-facets structures. In other embodiments, the semiconductor structure is configured to provide a laser device emitting radiation in the wavelength range from about 4.5 μm to about 5 μm, wherein the laser device is characterized by a room temperature $J_{th}$ value of no more than about 1.0 kA/cm², no more than about 0.9 kA/cm², no more than about 0.8 kA/cm², or no more than about 0.7 kA/cm² for 40-stage, 3 mm-long, high-reflectivity coated back-facet structures.

In some embodiments, the semiconductor structure is configured to provide a laser device emitting radiation in the wavelength range from about 4.5 to about 5 μm, wherein the laser device exhibits a room temperature CW maximum wallplug efficiency ($\eta_{wp.max}$) greater than about 15%, greater than about 20%, or greater than about 22%. The $\eta_{wp.max}$ value may be calculated from the appropriate equations found in D. Botez, et al., "Temperature dependence of the key electro-optical characteristics for mid-infrared emitting quantum cascade lasers," *Applied Physics Letters*, accepted for publication, July 2010.

Known methods may be used to form the disclosed semiconductor structures and laser devices. For example, semiconductor structures may be grown on an appropriate substrate (e.g., InP, GaAs, GaSb, and InAs) using metal-organic chemical vapor deposition (MOCVD).

Exemplary embodiments of the disclosed semiconductor structures are shown in FIGS. 2-5 and are further discussed below. FIG. 2A shows the band diagram and relevant wavefunctions for a semiconductor structure 200 under an applied field of 74 kV/cm. The semiconductor structure 200 is configured to provide a laser device emitting radiation at a wavelength of 4.64 μm. FIG. 2B shows the compositions and thicknesses of each of the quantum wells and barriers in the semiconductor structure 200 of FIG. 2A.

Referring to FIG. 2A, the semiconductor structure 200 includes an electron injector 202, an active region 204, and an electron extractor 206. The active region 204 includes an injection barrier 208, which is a composite injection barrier including a first barrier layer 210 and a second barrier layer 212. As discussed above, the energy of the injection barrier 208 will have an intermediate value between the energy of the first barrier layer 210 and the energy of the second barrier layer 212. The active region also includes an exit barrier 214, a first intermediate barrier 216, a second intermediate barrier 218, and a third intermediate barrier 220. The energy of each the injection barrier 208, the exit barrier 214, and the intermediate barriers 218-220 is greater than the energy of the barriers 224 in the electron injector 202. The energy of the injection barrier 208 is less than the energy of the exit barrier 214 and the energy of the first intermediate barrier 216 is less than the energy of the second intermediate barrier 218. In addition, the first intermediate barrier 216 is greater in energy than the injection barrier 208, the second intermediate barrier 218 is equal in energy to the exit barrier 214, and the third intermediate barrier 220 is equal in energy to the first intermediate barrier 216. The active region also includes quantum wells 222, which are deep quantum wells.

FIG. 2A also shows that the $E_{54}$ value for the semiconductor structure 200 is 77 meV and the $E_{65}$ value is 77 meV. As a result, electron leakage is greatly suppressed. The estimated, calculated relative leakage current, $J_{leak}/J_{th}$, at room temperature for a laser device including the semiconductor structure 200 is about 4%. This is about a factor of 2 less than state-of-the-art QCLs and about a factor of 4 less than conventional QCLs. The estimated, calculated room temperature $J_{th}$ value for a 30-stage, 3 mm-long, uncoated-facets device is about 1.57 kA/cm². This is about 14% smaller than both state-of-the-art and conventional QCLs of the same device parameters. However, the matrix element (i.e., $z_{43}$) of the lasing transition is 1.42 nm and the lifetimes $\tau_4$ and $\tau_3$ are 1.54 ps and 0.29 ps, respectively. These values are similar to those in conventional QCLs. For comparison, the electro-optical characteristics of state-of-the-art QCLs are as follows: room temperature $J_{leak}/J_{th}$ is about 9%; room temperature $J_{th}$ is about 1.83 kA/cm² for 30-stage, 3 mm-long, uncoated-facets devices; $z_{43}$=1.44 nm, $\tau_4$=1.37 ps and $\tau_3$=0.33 ps. Thus, the semiconductor structure 200 is capable of suppressing electron leakage and exhibiting much lower room temperature $J_{th}$ values without decreasing the matrix element between lasing levels, thereby providing high, front-facet CW wallplug efficiencies.

FIG. 3A shows the band diagram and relevant wavefunctions for a semiconductor structure 300 under an applied field of 82 kV/cm. The semiconductor structure 300 is configured to provide a laser device emitting radiation at a wavelength of 4.65 μm. FIG. 3B shows the compositions and thicknesses of each of the quantum wells and barriers in the semiconductor structure 300 of FIG. 3A.

Referring to FIG. 3A, the semiconductor structure 300 includes an electron injector 302, an active region 304, and an electron extractor 306. The active region 304 includes an injection barrier 308, an exit barrier 310, a first intermediate barrier 312, a second intermediate barrier 314, and a third intermediate barrier 316. The energy of each of the injection barrier 308, the exit barrier 314, and the intermediate barriers 312-316 is greater than the energy of the barriers 320 in the electron injector 302. The energy of the injection barrier 308 is less than the energy of the exit barrier 310 and the energy of the first intermediate barrier 312 is less than the energy of the second intermediate barrier 314. In addition, the first intermediate barrier 312 is equal in energy to the injection barrier 308, the second intermediate barrier 314 is equal in energy to the exit barrier 310, and the third intermediate barrier 316 is equal in energy to the first intermediate barrier 312. The active region also includes quantum wells 318, which are deep quantum wells.

FIG. 3A also shows that the $E_{54}$ value for the semiconductor structure 300 is 75 meV and the $E_{65}$ value is 83 meV. As a result, electron leakage is greatly suppressed. The estimated, calculated relative leakage current, $J_{leak}/J_{th}$, at room temperature for a laser device including the semiconductor structure 300 is about 4%. This is about a factor of 2 less than state-of-the-art QCLs and about a factor of 4 less than conventional QCLs. The estimated, calculated room temperature $J_{th}$ value for a 30-stage, 3 mm-long, uncoated-facets device is about 1.64 kA/cm². This is about 10% smaller than both state-of-the-art and conventional QCLs of the same device parameters. However, the matrix element (i.e., $z_{43}$) of the lasing transition is 1.45 nm and the lifetimes $\tau_4$ and $\tau_3$ are 1.47 ps and 0.35 ps, respectively. These values are similar to those in conventional QCLs. Thus, the semiconductor structure 300 is capable of suppressing electron leakage and exhibiting much lower room temperature $J_{th}$ values without decreasing the matrix element between lasing levels, thereby providing high, front-facet CW wallplug efficiencies.

FIG. 4A shows the band diagram and relevant wavefunctions for a semiconductor structure 400 under an applied field of 74 kV/cm. The semiconductor structure 400 is configured to provide a laser device emitting radiation at a wavelength of 4.60 μm. FIG. 4B shows the compositions and thicknesses of each of the quantum wells and barriers in the semiconductor structure 400 of FIG. 4A.

Referring to FIG. 4A, the semiconductor structure 400 includes an electron injector 402, an active region 404, and an electron extractor 406. The active region 404 includes an injection barrier 408, an exit barrier 410, a first intermediate barrier 412, a second intermediate barrier 414, and a third intermediate barrier 416. The energy of each the injection barrier 408, the exit barrier 410, and the intermediate barriers 412-416, is greater than the energy of the barriers 420 in the electron injector 402. The energy of the injection barrier 408 is less than the energy of the exit barrier 410 and the energy of the first intermediate barrier 412 is less than the energy of the second intermediate barrier 414. The first intermediate barrier 412 is equal in energy to the injection barrier 408, the energy of the second intermediate barrier 414 is less than the energy of the exit barrier 410, and the energy of the third intermediate barrier 416 is both greater than the energy of the first intermediate barrier 412 and less than the energy of the second intermediate barrier 414. The active region also includes quantum wells 418, which are deep quantum wells.

FIG. 4A also shows that the $E_{54}$ value for the semiconductor structure 400 is 84 meV and the $E_{65}$ value is 101 meV. These are the largest such values achieved for any type of QCL device. As a result, electron leakage is greatly suppressed. In particular, the calculated room temperature relative leakage current, $J_{leak}/J_{th}$, for a laser device including the semiconductor structure 400 is about 2.7%. This is about a factor of 3 less than state-of-the-art QCLs and about a factor of 6 less than conventional QCLs. The calculated room temperature $J_{th}$ value for a 30-stage, 3 mm-long, uncoated-facets laser device including the semiconductor structure 400 is about 1.5 kA/cm². This is about 18% smaller than both state-of-the-art and conventional QCLs of the same device parameters. However, the matrix element (i.e., $z_{43}$) of the lasing transition is 1.4 nm, and the lifetimes $\tau_4$ and $\tau_3$ are 1.59 ps and 0.36 ps, respectively. These values are similar to those in conventional QCLs.

The combination of low $J_{th}$ values and virtually suppressed electron leakage leads to significantly higher CW wallplug efficiencies at room temperature. In particular, the estimated pulsed room temperature $\eta_{wp, max}$ for the front-facet emitted power of a high-reflectivity-coated back facet device (i.e., the usable power) including the semiconductor structure 400 is about 22.7%. This is about 1.6 times higher than the best pulsed $\eta_{wp, max}$ values published to date for single-facet power. See R. Maulini et al., Appl. Phys. Lett., 95, 151112 (2009). The estimated front-facet room temperature CW $\tau_{wp, max}$ for a 40-stage, 3 mm-long, high-reflectivity-coated back facet laser device including the semiconductor structure 400 is about 21.5%. This is about two times the best room temperature CW $\tau_{wp, max}$ value obtained to date from any kind of QCL. Finally, the CW wallplug efficiency varies with temperature about 3 times more slowly as compared to conventional QCLs.

FIG. 5A shows the band diagram and relevant wavefunctions for a semiconductor structure 500 under an applied field of 74 kV/cm. The semiconductor structure 500 is configured to provide a laser device emitting radiation at a wavelength of 4.6 μm. FIG. 5B shows the compositions and thicknesses of each of the quantum wells and barriers in the semiconductor structure 500 of FIG. 5A.

Referring to FIG. 5A, the semiconductor structure 500 includes an electron injector 502, an active region 504, and an electron extractor 506. The active region 504 includes an injection barrier 508, which is a composite barrier composed of a first barrier layer 510 and a second barrier layer 512. As discussed above, the energy of the injection barrier 508 will have an intermediate value between the energy of the first barrier layer 510 and the energy of the second barrier layer 512. The active region also includes an exit barrier 514, a first intermediate barrier 516, a second intermediate barrier 518, and a third intermediate barrier 520. The energy of each of the injection barrier 508, the exit barrier 514, and the intermediate barriers 516-520, is greater than the energy of the barriers 524 in the electron injector 502. The energy of the injection barrier 508 is less than the energy of the exit barrier 514 and the energy of the first intermediate barrier 516 is less than the energy of the second intermediate barrier 518. The energy of the first intermediate barrier 516 is greater than the energy of the injection barrier 508, the energy of the second intermediate barrier 518 is greater than the energy of the exit barrier 514, and the third intermediate barrier 520 is equal in energy to the first intermediate barrier 516. The active region also includes quantum wells 522, which are deep quantum wells.

FIG. 5A also shows that the $E_{54}$ value for the semiconductor structure 500 is 79 meV and the $E_{65}$ value is 73 meV. As a result, electron leakage is greatly suppressed. The estimated, calculated relative leakage current, $J_{leak}/J_{th}$, at room temperature for a laser device including the semiconductor structure 500 is about 3.5%. This is about a factor of 2.5 less than state-of-the-art QCLs and about a factor of 4 less than conventional QCLs. The estimated, calculated room temperature $J_{th}$ value for a 30-stage, 3 mm-long, uncoated-facets device is about 1.36 kA/cm². This is about 26% smaller than both state-of-the-art and conventional QCLs of the same device parameters. The estimated, calculated room temperature $J_{th}$ value for a 40-stage, 3 mm-long, high-reflectivity-coated back facet device is even lower, about 0.67 kA/cm². In addition, the matrix element (i.e., $z_{43}$) of the lasing transition is 1.4 nm and the lifetimes $\tau_4$ and $\tau_3$ are 1.77 ps and 0.34 ps, respectively. Thus, the semiconductor structure 500 is capable of suppressing electron leakage and exhibiting much lower room temperature $J_{th}$ values without decreasing the matrix element between lasing levels, thereby providing high, front-facet CW wallplug efficiencies. In particular, the estimated front-facet room temperature CW $\eta_{wp, max}$ for a 40-stage, 3 mm-long, high-reflectivity-coated back facet laser device including the semiconductor structure 500 is 22%.

For the purposes of this disclosure and unless otherwise specified, "a" or "an" means "one or more". Still further, the use of "and" or "or" is intended to include "and/or" unless specifically indicated otherwise.

All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A semiconductor structure comprising:
an electron injector, an active region adjacent to the electron injector, and an electron extractor adjacent to the active region, the electron injector, active region, and electron extractor each comprising layers of semiconductor, the layers configured to provide alternating quantum wells and barriers, wherein the active region comprises an injection barrier, an exit barrier, a first intermediate barrier between the injection barrier and the exit barrier, and a second intermediate barrier between the injection barrier and the exit barrier and downstream from the first intermediate barrier, wherein the energy of each the injection barrier, the exit barrier, the first intermediate barrier, and the second intermediate barrier is greater than the energy of the barriers of the electron injector, and further wherein the energy of the injection barrier is less than the energy of the exit barrier, and the energy of the first intermediate barrier is less than the energy of the second intermediate barrier.

2. The semiconductor structure of claim 1, wherein the energy of the first intermediate barrier is equal to or greater than the energy of the injection barrier.

3. The semiconductor structure of claim 1, wherein the energy of the first intermediate barrier is equal to or greater than the energy of the injection barrier and the energy of the second intermediate barrier is equal to or less than the energy of the exit barrier.

4. The semiconductor structure of claim 1, wherein the energy of the first intermediate barrier is equal to or greater than the energy of the injection barrier and the energy of the second intermediate barrier is greater than the energy of the exit barrier.

5. The semiconductor structure of claim 1, further comprising a third intermediate barrier between the first intermediate barrier and the second intermediate barrier, wherein the energy of the third intermediate barrier is greater than the energy of the barriers in the electron injector.

6. The semiconductor structure of claim 5, wherein the energy of the first intermediate barrier is equal to or greater than the energy of the injection barrier, and the energy of the third intermediate barrier ranges from the energy of the first intermediate barrier to the energy of the second intermediate barrier.

7. The semiconductor structure of claim 5, wherein the energy of the first intermediate barrier is equal to or greater than the energy of the injection barrier, the energy of the second intermediate barrier is equal to or less than the energy of the exit barrier, and the energy of the third intermediate barrier ranges from the energy of the first intermediate barrier to the energy of the second intermediate barrier.

8. The semiconductor structure of claim 5, wherein the energy of the first intermediate barrier is equal to or greater than the energy of the injection barrier, the energy of the second intermediate barrier is greater than the energy of the exit barrier, and the energy of the third intermediate barrier ranges from the energy of the first intermediate barrier to the energy of the second intermediate barrier.

9. The semiconductor structure of claim 5, wherein the energy of the first intermediate barrier is greater than the energy of the injection barrier, the energy of the second intermediate barrier is equal to the energy of the exit barrier, and the energy of the third intermediate barrier is equal to the energy of the first intermediate barrier.

10. The semiconductor structure of claim 5, wherein the energy of the first intermediate barrier is equal to the energy of the injection barrier, the energy of the second intermediate barrier is equal to the energy of the exit barrier, and the energy of the third intermediate barrier is equal to the energy of the first intermediate barrier.

11. The semiconductor structure of claim 5, wherein the energy of the first intermediate barrier is equal to the energy of the injection barrier, the energy of the second intermediate barrier is less than the energy of the exit barrier, and the energy of the third intermediate barrier is both greater than the energy of the first intermediate barrier and less than the energy of the second intermediate barrier.

12. The semiconductor structure of claim 5, wherein the energy of the first intermediate barrier is greater than the energy of the injection barrier, the energy of the second intermediate barrier is greater than the energy of the exit barrier, and the energy of the third intermediate barrier is equal to the energy of the first intermediate barrier.

13. The semiconductor structure of claim 1, wherein the injection barrier is a composite injection barrier comprising a first barrier layer and a second barrier layer.

14. The semiconductor structure of claim 1, wherein at least one of the quantum wells of the active region is a deep quantum well.

15. The semiconductor structure of claim 1, wherein all of the quantum wells of the active region are deep quantum wells.

16. The semiconductor structure of claim 1, wherein the semiconductor structure comprises quantum wells comprising InGaAs and barriers comprising AlInAs.

17. The semiconductor structure of claim 1, wherein the active region comprises upper energy states 4, 5, and 6, and the energy difference between energy states 4 and 5 ($E_{54}$) is at least about 70 meV.

18. The semiconductor structure of claim 17, further wherein the energy difference between energy states 5 and 6 ($E_{65}$) is at least about 70 meV.

19. The semiconductor structure of claim 17, further wherein the energy difference between energy states 5 and 6 ($E_{65}$) is at least about 100 meV.

20. The semiconductor structure of claim 1, wherein the semiconductor structure is configured to provide a laser device emitting radiation in the wavelength range of about 4 µm to about 5 µm.

21. The semiconductor structure of claim 20, wherein the semiconductor structure is configured to provide the laser device characterized by a room temperature relative leakage current value ($J_{leak}/J_{th}$) of no more than about 5%.

22. The semiconductor structure of claim 20, wherein the semiconductor structure is configured to provide a laser device exhibiting a front-facet room temperature continuous wave maximum wallplug efficiency ($\eta_{wp,max}$) greater than about 20%.

23. A semiconductor structure comprising:
an electron injector, an active region adjacent to the electron injector, and an electron extractor adjacent to the active region, the electron injector, active region, and electron extractor each comprising layers of semiconductor, the layers configured to provide alternating quantum wells and barriers, wherein the active region comprises an injection barrier, an exit barrier, a first intermediate barrier between the injection barrier and the exit barrier, and a second intermediate barrier between the injection barrier and the exit barrier and downstream from the first intermediate barrier, wherein the energy of each the exit barrier, the first intermediate barrier, and the second intermediate barrier is greater than the energy of the barriers of the electron injector, and further wherein the energy of the injection barrier is less than the energy of the exit barrier, and the energy of the first intermediate barrier is less than the energy of the second intermediate barrier, and further wherein the semiconductor structure is configured to provide a laser device emitting at a wavelength greater than about 5 µm.

24. The semiconductor structure of claim 23, wherein the semiconductor structure is configured to provide a laser device emitting at a wavelength greater than about 8 µm.

25. A laser device comprising a plurality of laser stages, each laser stage comprising the semiconductor structure of claim 23.

26. A laser device comprising a plurality of laser stages, each laser stage comprising a semiconductor structure, the semiconductor structure comprising:

an electron injector, an active region adjacent to the electron injector, and an electron extractor adjacent to the active region, the electron injector, active region, and electron extractor each comprising layers of semiconductor, the layers configured to provide alternating quantum wells and barriers, wherein the active region comprises an injection barrier, an exit barrier, a first intermediate barrier between the injection barrier and the exit barrier, and a second intermediate barrier between the injection barrier and the exit barrier and downstream from the first intermediate barrier, wherein the energy of each the injection barrier, the exit barrier, the first intermediate barrier, and the second intermediate barrier is greater than the energy of the barriers of the electron injector, and further wherein the energy of the injection barrier is less than the energy of the exit barrier, and the energy of the first intermediate barrier is less than the energy of the second intermediate barrier.

* * * * *